(12) United States Patent
Thomas (10) Patent No.: US 6,741,102 B1
(45) Date of Patent: May 25, 2004

(54) PHASE FREQUENCY DETECTOR (75) Inventor: Thomas P. Thomas, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/300,757

(22) Filed: Apr. 26, 1999

Related U.S. Application Data (63) Continuation of application No. 08/820,154, filed on Mar. 19, 1997, now Pat. No. 5,963,058.

(51) Int. Cl.[7] .............................................. H03L 7/089
(52) U.S. Cl. .............................................. 327/3; 327/12
(58) Field of Search ................................ 327/2, 3, 5, 7, 327/8, 10, 12

(56) References Cited

U.S. PATENT DOCUMENTS

| | | | | | |
|---|---|---|---|---|---|
| 4,568,881 | A | * | 2/1986 | Kostrov | 327/10 |
| 4,970,475 | A | * | 11/1990 | Gillig | 327/3 |
| 5,142,555 | A | * | 8/1992 | Whiteside | 327/2 |
| 5,592,110 | A | * | 1/1997 | Noguchi | 327/7 |

* cited by examiner

*Primary Examiner*—Tuan T. Lam
(74) *Attorney, Agent, or Firm*—Michael J. Nesheiwat

(57) ABSTRACT

Briefly, in accordance with one embodiment, an integrated circuit includes a phase-frequency detector (PFD) including two clock input ports, an up signal port and a down signal port. The PFD includes digital circuitry including transistors coupled in a configuration to adjust an amount of overlap of an up output signal pulse and a down output signal pulse based, at least in part, upon the magnitude of an amount of phase delay between two respective clock signal pulses applied to the two input ports. Of course, additional embodiments are also disclosed.

9 Claims, 5 Drawing Sheets

PHASE FREQUENCY DETECTOR

RELATED APPLICATION

This patent application is a continuation patent application of U.S. patent application Ser. No. 08/820,154, now U.S. Pat. No. 5,963,058, entitled "Phase Frequency Detector," by Thomas P. Thomas, filed on Mar. 19, 1997.

BACKGROUND OF THE INVENTION

1. Field of the Invention

The present invention relates to a phase frequency detector and, more particularly, to a phase frequency detector (PFD), such as may be employed in a phase-locked loop (PLL), for example.

2. Background Information

Figure 1:
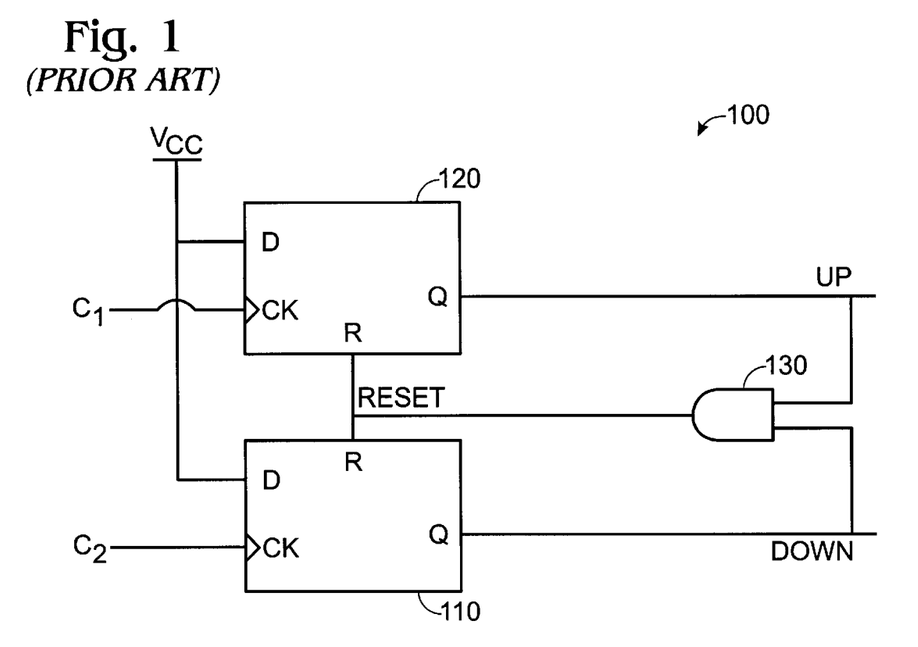
FIG. 1 is a schematic diagram illustrating an embodiment of a conventional phase-frequency detector (PFD)
Figure 2:
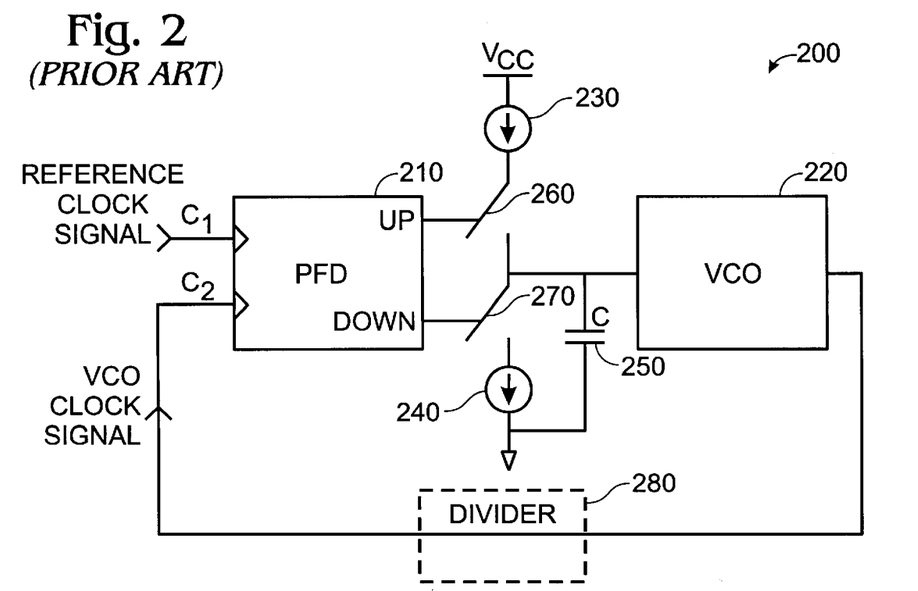
FIG. 2 is a schematic diagram illustrating an embodiment of a conventional phase-locked loop (PLL)

FIG. 1 is a schematic diagram illustrating a conventional phase frequency detector to show the principle of operation. Likewise, FIG. 2 is a simplified schematic diagram illustrating a conventional phase-locked loop (PLL). The particular PLL illustrated is a charge pump PLL. Of course, a PFD may also be employed in a delay-locked loop (DLL) or in other circuits. As illustrated in FIG. 2, voltage-controlled oscillator (VCO) 220 produces a VCO output clock signal C2. VCO output clock signal C2 may be fed back directly or through a divider 280 if frequency multiplication is employed, although the following discussion assumes no divider. Phase frequency detector (PFD) 210 compares the phase and frequency of VCO clock signal C2 with the phase and frequency of reference clock signal C1. Based upon the phase delay between the two clock signals, phase frequency detector 210 produces an up signal and a down signal. These different signals are produced by different output ports. As illustrated in FIG. 2, these up and down signals are applied to control switches of a charge pump that will short circuit an electrical path including a current source, such as current sources 230 and 240. Thus, as illustrated in FIG. 2, when these switches close, current flows to charge or discharge capacitor 250. Therefore, depending upon the duration of the up signal and the down signal produced by phase frequency detector 210, the voltage on capacitor 250 is adjusted. Likewise, depending upon which switch(es) is (are) closed and the respective durations of the signals applied, the voltage across capacitor 250 may either increase or decrease. Furthermore, as illustrated in FIG. 2, capacitor 250 is coupled to voltage-controlled oscillator 220 so that the frequency of the output clock signal produced by VCO 220 will be adjusted in response to the voltage of capacitor 250. Therefore, a delay between VCO clock signal C2 and reference clock signal C1 should become smaller based, at least in part, upon the negative feedback operation of the PLL. When the output clock signal of VCO 220 closely matches reference clock signal C1 in phase and frequency, the PLL is "locked".

FIG. 1 illustrates a conventional PFD. As illustrated in FIG. 1, this PFD includes two flip-flops 110 and 120 clocked by clock signals C1 and C2. As illustrated, each flip-flop includes a data port ("D"), a clock port ("CK"), and an output signal port ("Q"). The two flip-flops are reset when both flip-flop output signal ports are active. This reset is accomplished by the output signal of AND gate 130. As is well-known, in the response curve of a PFD, a "dead zone" may occur around zero phase delay due to the limited ability of the PFD to produce, or circuits in the charge pump to respond to, relatively short up pulses or down pulses. For the PFD illustrated in FIG. 1 to avoid a dead zone, the reset path including AND gate 130 includes some delay allowing both flip-flop output signal ports to be active simultaneously for a short overlapping time.

Nonetheless, the PFD illustrated in FIG. 1 has some disadvantages. The delay in the reset path limits the speed of the PFD. Furthermore, the range of phase delays that the PFD is able to accommodate is limited by the reset delay. More specifically, the reset delay may result in the PFD missing a positive clock pulse edge transition as the magnitude of the phase delay between the two clock signals approaches a significant proportion of 360°. This missed positive clock pulse edge transition limits the range of phase delays the PFD is able to accommodate and, therefore, increases cycle slip and, hence, lock time of a PLL employing such a PFD. A need, therefore, exists for a PFD that addresses these problems.

SUMMARY OF THE INVENTION

Briefly, in accordance with one embodiment of the invention, an integrated circuit includes: a phase frequency detector (PFD) including two clock input ports, an up signal output port, and a down signal output port. The PFD includes digital circuitry including transistors coupled in a configuration to adjust an amount of overlap of an up signal and a down signal based, at least in part, upon the magnitude of an amount of phase delay between two clock signals respectively applied to the PFD input ports.

Briefly, in accordance with another embodiment of the invention, an integrated circuit includes: a phase frequency detector (PFD) including two clock input ports, an up signal output port, and a down signal output port. The PFD includes digital circuitry including transistors coupled in a configuration to produce a PFD output signal in which the sign of the phase delay indicated remains the sign of the phase delay between the applied clock signals even as the magnitude of the phase delay approaches a significant proportion of 360°.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description, when read with the accompanying drawings, in which:

DETAILED DESCRIPTION OF THE INVENTION

In the following detailed description numerous specific details are set forth in order to provide a thorough understanding of the invention. However, it will be understood by those skilled in the art that the present invention may be practiced without these specific details. In other instances, well-known methods, procedures, components, and circuits have not been described in detail so as not to obscure the present invention.

As previously described, the PFD illustrated in FIG. 1 has a number of disadvantages. For example, as previously described, the reset path introduces a delay and, ultimately, limits the speed of the PFD. This occurs because the reset path, including AND gate 130, operates as a critical path in the circuit. More specifically, the clock signals are applied to a clock signal input port of flip-flops 110 and 120, respectively. Once the output signals of the flip-flops have changed state in response to the clock signals applied, these output signals then propagate through AND gate 130 before flip-flops 110 and 120 are reset. The reset path also includes some delay to address a dead zone, as explained earlier. Reset of the flip-flops should be accomplished before application of the next clock pulses of the applied clock signals. Therefore, because the flip-flops are reset based, at least in part, upon the output signals and because these output signals propagate through AND gate 130, this reset path limits the frequency of the clock signals that the PFD may accommodate.

Figure 5:
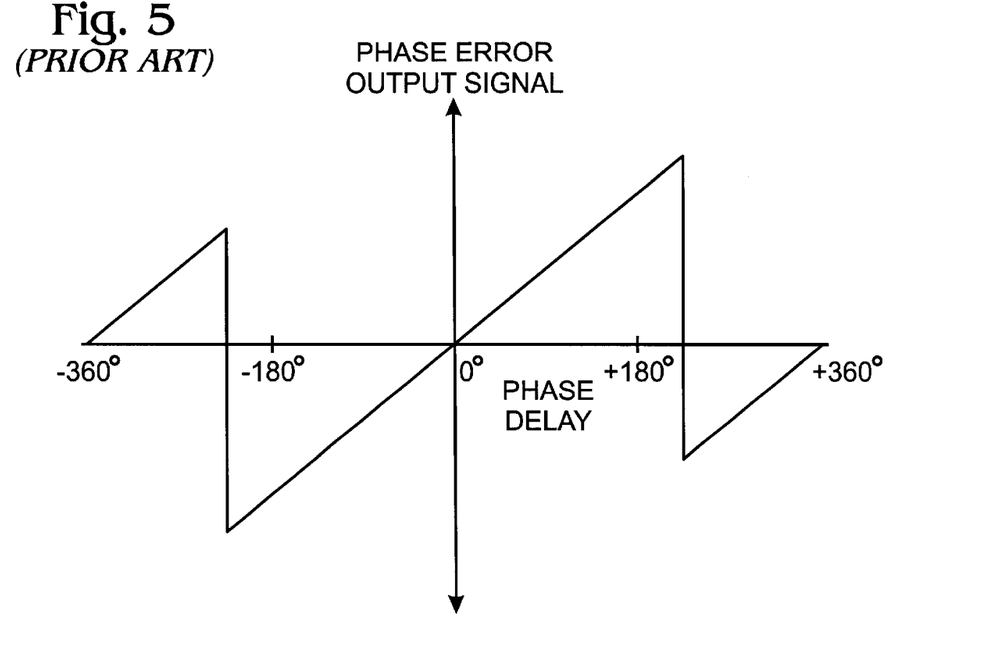
FIG. 5 is a plot illustrating a response curve for the embodiment illustrated in FIG. 2.

Another disadvantage associated with the embodiment of a conventional PFD illustrated in FIG. 1 is illustrated by the plot in FIG. 5. As illustrated, if the phase delay between the reference clock signal and the VCO output clock signal is sufficiently large, such as close to 360° then the phase error output signal for the PLL indicates a smaller phase error, such as close to 0° for a portion of the response curve. There is a negative phase error output signal if the phase delay is positive and a positive phase error output signal if the phase delay is negative. Therefore, this type of behavior limits the usable phase range of the PFD.

Figure 7:
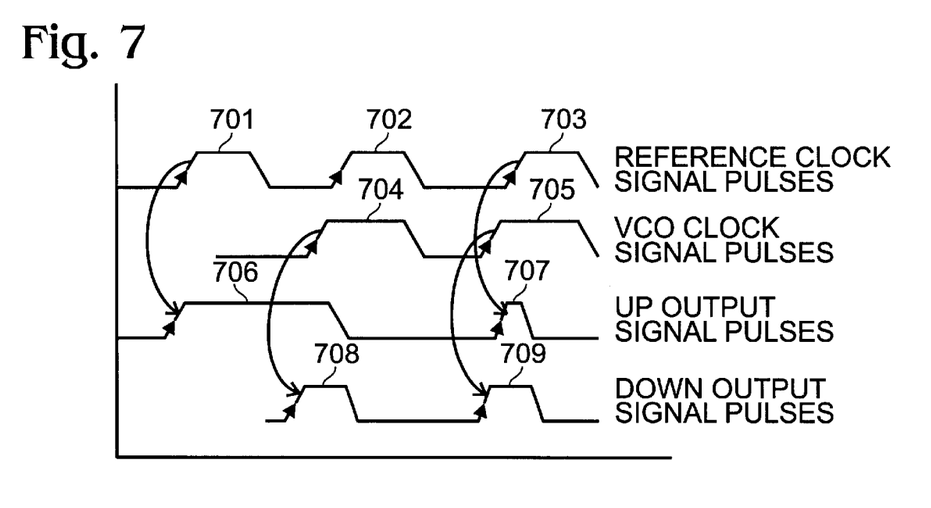
FIG. 7 is a timing diagram illustrating pulses associated with the embodiment of a conventional PFD illustrated in FIG. 1.

A reason this type of behavior is exhibited by the embodiment illustrated in FIG. 1 also relates to the delay in the reset path of that embodiment, as illustrated in more detail by the timing diagram of FIG. 7. In this figure, arrows illustrate a timing relation between the occurrence of an output pulse and the positive edge transition of a clock pulse of a clock signal applied to this particular embodiment. If the phase difference between a clock pulse, such as 701, of the reference clock signal and a clock pulse, such as 704, of the VCO clock signal is sufficiently large, so that the positive edge transition for pulse 704 of the VCO clock signal, for example, is relatively close in terms of phase delay to the positive edge transition of the next clock pulse of the reference clock signal, such as 702, then the delay through the flip-flops and the AND gate will mask the positive edge transition of the next clock pulse of the reference clock signal, such as 702, so that this positive edge transition is essentially ignored by the PFD. When this occurs, the next clock pulse positive edge transition recognized by the PFD is the positive transition edge of the next clock pulse of the VCO clock signal, such as 705, and because, now, it is preceding the next clock pulse for the reference clock signal, such as 703, the phase delay output signal produced changes magnitude and sign.

Figure 3:
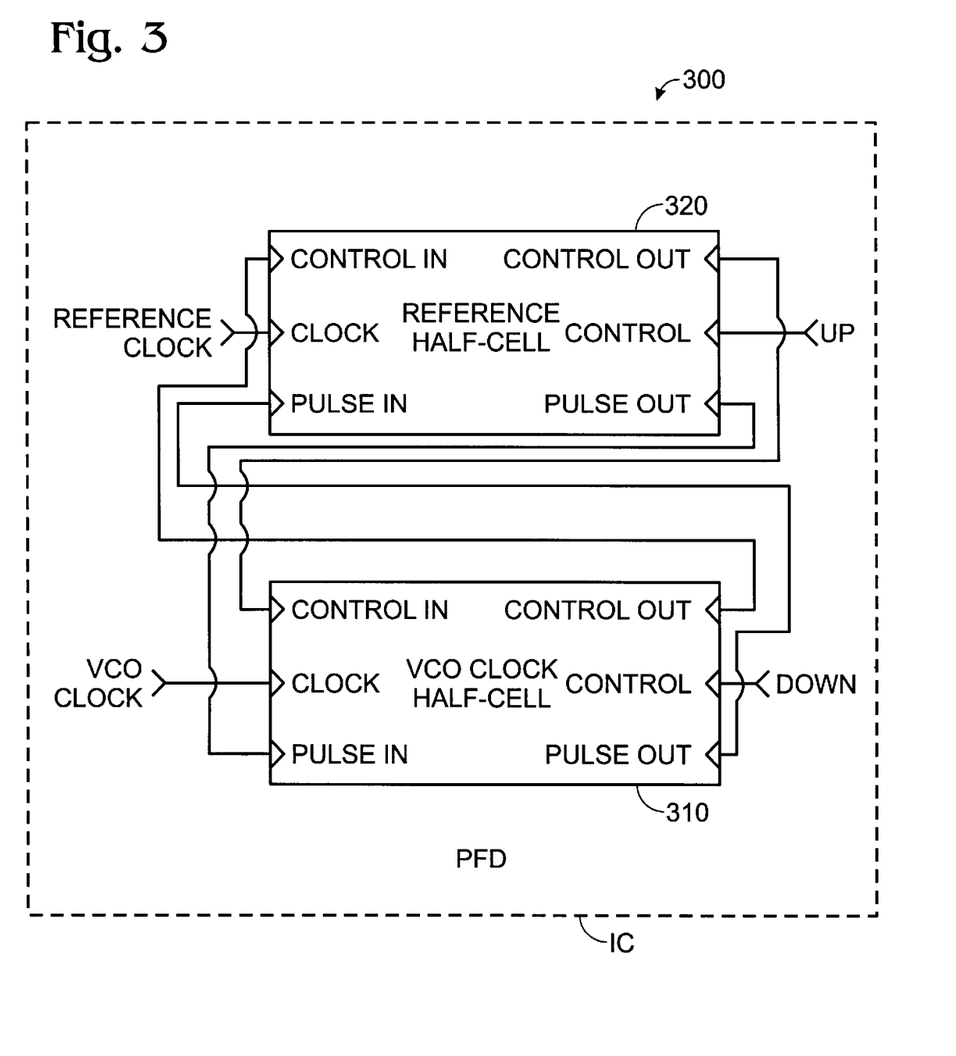
FIG. 3 is a block diagram illustrating electrical couplings for an embodiment of a phase-frequency detector in accordance with the invention.
Figure 4:
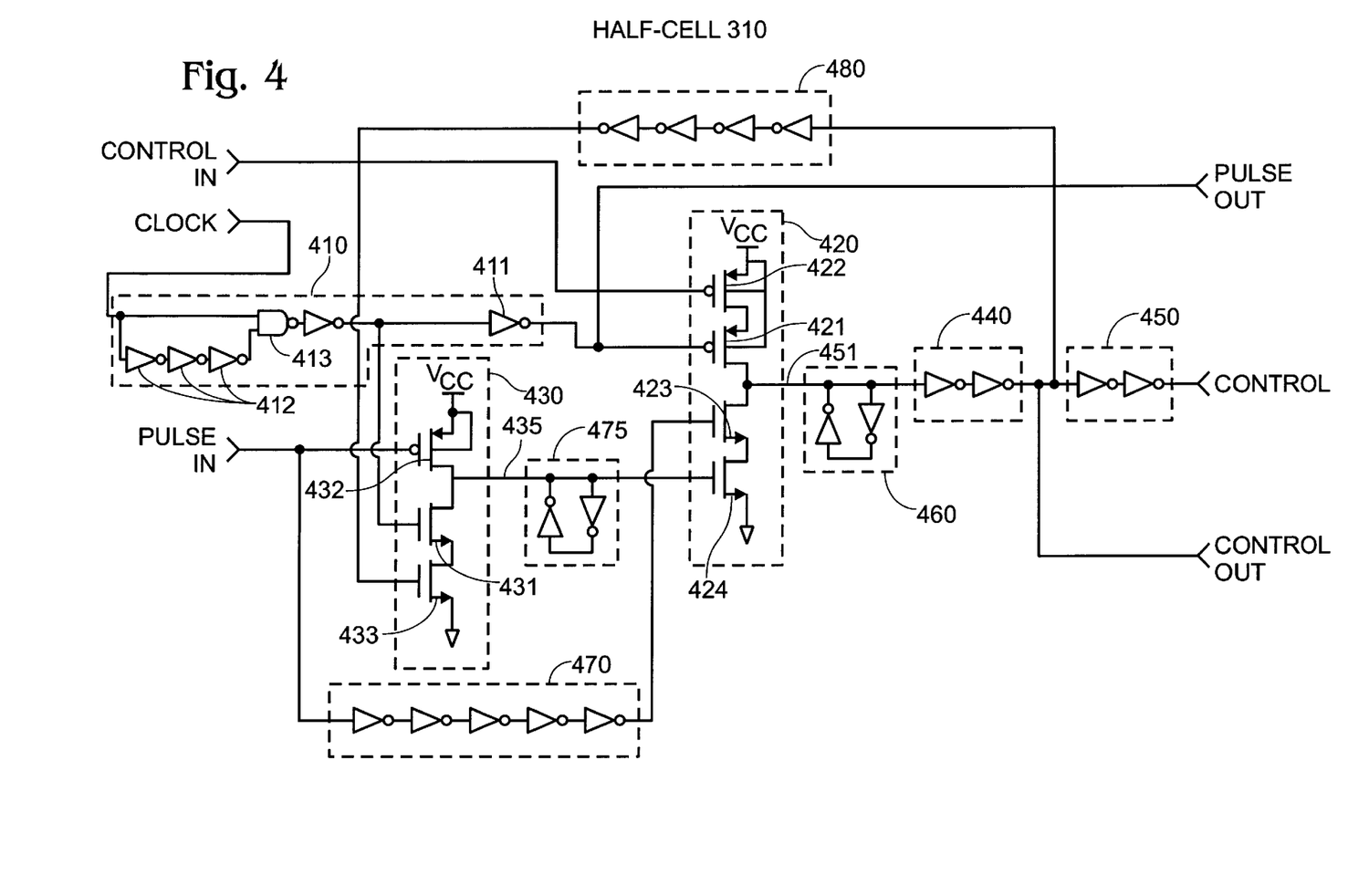
FIG. 4 is a schematic diagram illustrating one of the blocks in FIG. 3 in greater detail.

FIG. 3 is a block diagram illustrating two half-cells of an embodiment 300 of a PFD in accordance with the invention, including electrical couplings. Likewise, FIG. 4 illustrates in greater detail one of the half-cells of FIG. 3. For the embodiment illustrated in FIG. 3, half-cells 310 and 320 are substantially similar. Furthermore, as illustrated, each in this embodiment includes a clock signal input port ("clock"), a control signal input port ("control in"), a pulse signal input port ("pulse in"), a control signal output port ("control out"), a pulse signal output port ("pulse out"), and a port providing the output signal of the half-cell, such as for use by a charge pump of a PLL ("control"). Likewise, as illustrated in FIG. 3, the "control in" port of half-cell 320 is coupled to "control out" port of half-cell 310 while the "control in" port of half-cell 310 is coupled to the "control out" port of half-cell 320. Likewise, the "pulse in" port of half-cell 320 is coupled to the "pulse out" port of half-cell 310 while the "pulse in" port of half-cell 310 is coupled to the "pulse out" port of half-cell 320. In addition, in this particular embodiment, the clock signal input port for half-cells 310 and 320 are respectively coupled to receive a VCO output clock signal and a reference clock signal. Likewise, in this particular embodiment, half-cell 310 provides a down output signal pulse for the PFD whereas half-cell 320 provides an up output signal pulse for the PFD, although, of course, the invention is not limited in scope in this respect. In this context, "PFD output signal" refers to the difference between the up output signal pulse and the down output signal pulse.

In FIG. 3, the embodiment of a PFD in accordance with the invention is illustrated as embodied on an integrated circuit (IC) chip, although the invention is not restricted in its scope in this respect. As will be explained in more detail hereinafter, embodiment 300 includes digital dynamic logic circuitry including complementary metal-oxide semiconductor (CMOS) transistors coupled in a configuration to adjust an amount of overlap of an up signal pulse and a down signal pulse based, at least in part, upon the magnitude of an amount of phase delay between two clock pulsess, such as a reference clock signal pulse and a VCO clock signal pulse, applied to the PFD. However, if, in this embodiment, for example, the magnitude of the amount of phase delay between the reference clock signal pulse and the VCO clock signal pulse is more than a particular value, the digital logic circuitry is coupled in a configuration to produce either only an up signal pulse or only a down signal pulse. For the embodiment of a PFD illustrated in FIG. 3, digital dynamic logic circuitry is further included, including CMOS transistors, coupled in a configuration to produce a PFD output signal in which the sign of the phase delay indicated by the output signal remains the sign of the phase delay between two clock pulses applied to the PFD, even as the magnitude of the phase delay between the two clock pulses applied to the PFD, such as between the reference clock signal pulse and the VCO clock signal pulse, approaches a significant proportion of 360°. Of course, these features may also be employed separately in different embodiments of a PFD in accordance with the invention. Typically, the PFD will be coupled in a PLL, although the invention is not restricted in scope in this respect. As previously illustrated, a PLL typically produces a feedback clock signal, such as for the embodiment illustrated in FIG. 1, the VCO clock signal, for example. Typically, the PLL also produces an error signal to be used as a negative feedback signal.

FIG. 4 is a circuit diagram illustrating in more detail a half-cell of the embodiment of a PFD in accordance with the invention illustrated in FIG. 3. It is, of course, understood by one of ordinary skill in the art that the invention is not restricted in scope to this particular embodiment. A variety of embodiments may be devised to implement a phase frequency detector in accordance with the present invention. This particular embodiment using pulse driven dynamic CMOS logic is provided as one example of such an embodiment. As an example without limitation, although this embodiment is implemented using CMOS transistors, an alternative embodiment may be implemented using bipolar transistors or both CMOS and bipolar transistors. As illustrated in FIG. 4, half-cell 310 comprises pulse generator 410, a first stage 420, a second stage 430, a first time delay 470, a second time delay 480, sustainers 460 and 475, and buffers 440 and 450. Furthermore, although half-cell 310 is illustrated in FIG. 4, half-cell 320 is substantially similar for this particular embodiment.

Pulse generator 410 includes both an input port to receive a clock pulse of a clock signal and an output port. First stage 420 includes multiple input ports and an output port. The output port of pulse generator 410 is coupled to one of the multiple input ports of the first stage to "set" the output port of the first stage in response to the input port of the pulse generator receiving a clock signal. More specifically, in this embodiment, a pulse provided by the pulse generator from a positive or a rising clock pulse edge transition applied to the input port of the pulse generator drives the gate of positive metal-oxide semiconductor (PMOS) transistor 421 and, therefore, sets the output port of first stage 420 if the gate of PMOS transistor 422 is low. Of course, the invention is not restricted in scope to the particular signal conventions employed in this particular embodiment, such as "set," "high," and "low." A second of the multiple input ports of the first stage, the gate of PMOS transistor 422 in this embodiment, is coupled to the output port of the first stage of the other half-cell to inhibit the setting of the output port of the first stage for this particular half-cell if a clock pulse applied to the input port of the pulse generator of this particular half-cell is sufficiently delayed relative to the clock pulse applied to the pulse generator of the other half-cell. It is, of course, understood based on the previous description that for this particular embodiment the two half-cells are substantially similar and, therefore, half-cell 320 includes substantially the same circuitry to inhibit the setting of its first stage output port as well if a clock pulse applied to its pulse generator is sufficiently delayed.

The output port of the pulse generator of the other half-cell is coupled through an inverting time delay, such as time delay 470 in FIG. 4, to a third of the multiple input ports, such as the gate of negative metal-oxide semiconductor (NMOS) transistor 423 of the first stage to reset the output port of the first stage provided NMOS transistor 424 is on. Therefore, based on the previous description, for small phase delays or phase differences, the output signals of the respective half-cells, the up signal and the down signal, will be set a phase delay apart (first "control" signal port produced by the half-cell receiving the early clock pulse) due to the delay through first stage 420 and buffer 440 to apply a signal to transistor 422 (or the corresponding transistor on the other half-cell 320). Likewise, both up and down signals will be reset a phase delay apart (first "control" signal port produced by the half-cell receiving the late clock pulse) by transistor 423 (and its equivalent on the other half-cell 320).

Half-cell 310 includes a second stage 430. One of the multiple input ports of the second stage, the gate of PMOS transistor 432 in this particular embodiment, is coupled to the output port of the pulse generator of the other half-cell to set the output port of second stage 430. Likewise, the output port of second stage 430 is coupled to a fourth of the multiple input ports of first stage 420, the gate of transistor 424 in FIG. 4, to allow the third of the multiple input ports of first stage 420, the gate of transistor 423, to reset the output port of the first stage when the output port of the second stage is set. Of course, as previously described, the gate of transistor 423 is set via inverting time delay 470.

As illustrated in FIG. 4, pulse generator 410 includes an inverter 411 before the output port of the pulse generator. A second of the multiple input ports of second stage 430, in this case the gate of transistor 431, is coupled to pulse generator 410 ahead of inverter 411 to reset the output port of second stage 430 via NMOS transistor 431. Likewise, a third of the multiple input ports of second stage 430, the gate of transistor 433, is coupled to the output port of first stage 420 via a second time delay 480 to inhibit the second of the multiple input ports of second stage 430, in this case NMOS transistor 431, from resetting the output port of the second stage, when transistor 433 is off.

A clock pulse may be applied to pulse generator 410 while a signal originating from the other half-cell is propagating through time delay 470. Therefore, transistor 431 in FIG. 4 resets the output port of second stage 430, inhibiting the pulse propagating through time delay 470 from resetting the output port of first stage 420 via transistor 423. For this situation to arise, a large phase difference or delay will exist between the two clock signals applied, such as the reference clock signal and the VCO clock signal. By inhibiting transistor 423 from resetting the output port of first stage 420, the output signal produced by the half-cell remains high indicating a large phase delay, as desired. Alternatively, if the ability of transistor 423 to reset the output port of first stage 420 were not inhibited via the output port of second stage 430 coupling to transistor 424, the positive clock pulse edge transition applied to pulse generator 410 would effectively be ignored, such as illustrated previously and described in connection with FIG. 7 for a conventional PFD. If this occurred, then the circuit would indicate a small phase delay of the opposite sign starting from the next positive clock pulse edge transition. The other half-cell would produce a control output pulse from the application of the next positive clock pulse edge transition to its pulse generator and, therefore, the two clock pulses applied to the two half-cells would appear to have a smaller phase delay closer to 0°, but with the opposite sign, rather than a large phase delay closer to 360°, as illustrated and discussed in connection with FIG. 7.

In this particular embodiment, transistor 432 of second stage 430, which is made stronger than the series combination of transistors 431 and 433, has the ability to overpower transistors 431 and 433. Furthermore, as previously indicated, transistor 431 is coupled to pulse generator 410 ahead of inverter 411, rather than being coupled to the output port of the pulse generator. Therefore, when the phase delay of the two clock signals applied to the two input ports of the PFD is extremely close to positive or negative 360°, this particular embodiment of a PFD in accordance with the invention will produce a small phase error output signal, such as produced by a phase delay or phase difference very close to zero degrees but having an opposite sign. This is illustrated by the plot in FIG. 6 of the response curve of the embodiment of FIG. 3. Likewise, transistor 433 of second stage 430 has its gate coupled to the output port of first stage 420 via buffer 440 and second time delay 480. This inhibits the same pulse produced by pulse generator 410 that sets the output port of first stage 420 via transistor 421 from incorrectly resetting the output port of second stage 430 via transistor 431.

The operation of an embodiment of a PFD in accordance with the invention may occur as follows. When a rising or positive edge transition of a clock pulse is applied to the input port of pulse generator 410 of half-cell 310 illustrated in FIG. 4, for example, due to the delay through inverters 412, NAND gate 413 and, hence, pulse generator 410 produces a pulse in response. In this particular embodiment, the pulse produced is a negative going pulse since the output port of pulse generator 410 provides a high signal when no input clock pulse rising edge transition signal is applied. Of course, any one of a number of pulse generators may be employed. Furthermore, as previously indicated, the invention is not restricted in scope to the particular signal conventions employed in this particular embodiment, such as the particular state of a particular signal. The pulse produced at the output port of generator 410 drives PMOS transistor 421 of first stage 420 and, therefore, sets the output port at the first stage, designated 451 in FIG. 4. Of course, for transistor 421 to set the output port of the first stage, the signal applied to the "control in" port of this half-cell should be low so that PMOS transistor 422 in this particular embodiment provides a short circuit electrical path to Vcc. When output port 451 is set, sustainer 460 operates to maintain the state of the signal produced. Of course, the invention is not limited in scope to a sustainer or to this particular sustainer which comprises a pair of small, weak inverters coupled in a positive feedback loop, as illustrated. Likewise, buffer 440 drives the coupling from the "control out" port of half-cell 310 to the "control in" port of half-cell 320 (not shown) and also the input port of delay 480 with the signal value produced at the output port of first stage 420. Therefore, buffer 440 drives a PMOS transistor in half-cell 320 equivalent to transistor 422 of half-cell 310, as explained in more detail below. As illustrated, buffer 440 comprises two inverters. Buffer 450 drives the "control" port to reduce the effect of external loading on internal timing. Of course, the invention is not restricted in scope to using buffers in this particular manner or to these particular buffers.

The other half-cell, in this case half-cell 320, provides a pulse to the "pulse in" port of half-cell 310. As in half-cell 310, this pulse from 320 is produced by the pulse generator which is coupled to the "pulse out" port of that half-cell. This pulse, after a time delay due to first delay 470, drives transistor 423 of the first stage and, therefore, resets the state of the output port of the first stage. This assumes transistor 424 provides a short circuit electrical path to ground, which will typically be the case where the output signal of 430 is high after transistor 432 of the second stage 430 provided a short circuit to Vcc for output port 435 of the second stage due to the pulse from half-cell 320. In this situation, the series combination of transistors 431 and 433 does not provide a short circuit path to ground. Likewise, as previously discussed with respect to output port 451 and sustainer 460, here sustainer 475 operates to maintain the state of output port 435.

For small phase differences between the clock signals applied to the two input ports, the rising or positive edge transition for the up output pulse signal and for the down output pulse will be set a phase delay apart due to the delay through the equivalent to first stage 420 and buffer 440 on half-cell 320 to inactivate transistor 422. The half-cell to which the early or first rising clock pulse edge transition signal is applied, assume for this case half-cell 310, will produce the first positive edge transition at output port 451. The negative edge transition for the up output pulse and the down output pulse will also be a phase delay apart due, at least in part, to transistor 423 (and its equivalent on the other half-cell), as previously described. However, the half-cell to which the later or second rising clock pulse edge transition is applied, in this case 320, will produce the first negative edge transition signal. For larger or greater phase delays, only one positive and one negative edge transition will be produced by the same half-cell because the first clock pulse applied has sufficient time to propagate through the first stage and produce a signal that inactivates the equivalent of transistor 422 in half-cell 320. Therefore, the half-cell to which the second or late clock pulse is applied does not produce a positive or negative edge transition, in this case, half-cell 320. Therefore, this particular embodiment provides a variable overlap that reduces to no overlap for a sufficiently large phase delay between the two applied clock signals. In this embodiment, the only effect of the second or late clock pulse is to reset the first stage of the other half-cell, in this case 310, provided the output port of the second stage is high in that half-cell.

Figure 6:
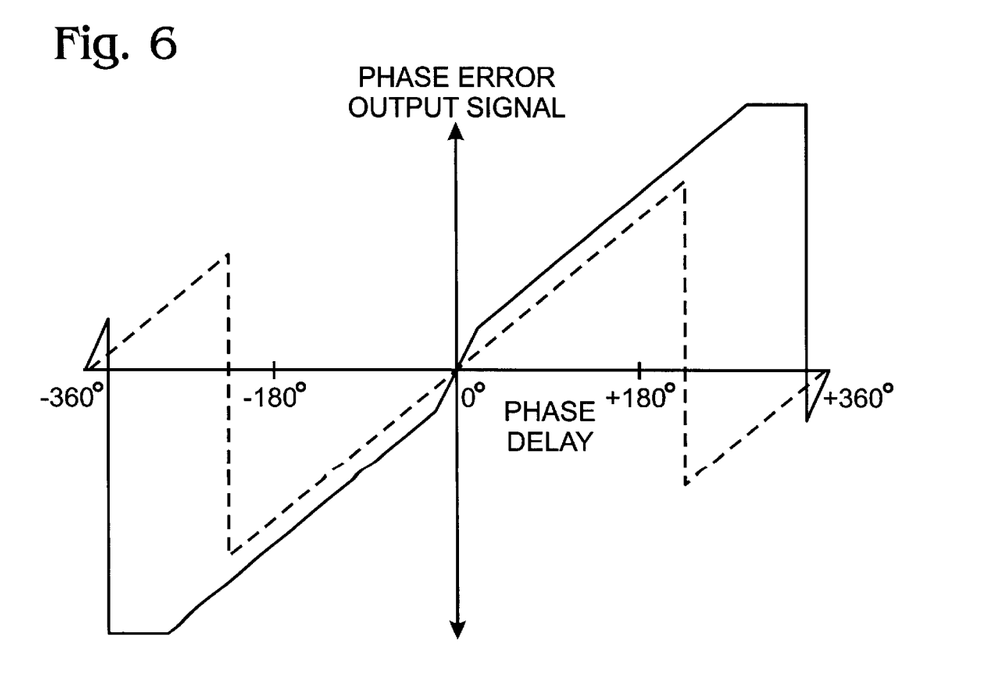
FIG. 6 is a plot illustrating a response curve for the embodiment illustrated in FIG. 3 with the response curve of FIG. 5 shown as a dotted line.

Second stage 430 disables the reset of first stage 420 by inactivating NMOS transistor 424 of the first stage. As previously described, typically, transistor 432 will be activated by a pulse from the other half-cell. This enables transistor 423 to reset the output port of the first stage. However, as previously described and illustrated in FIG. 7, if the phase delay is sufficiently large, the next rising clock pulse edge transition signal applied to half-cell 310, for example, may be ignored and result in output signals indicating a small phase delay of opposite sign, rather than correctly indicating a large phase delay. In this particular embodiment, if another positive clock pulse edge transition signal is applied to the half-cell receiving the early or first clock signal, in this case 310, for example, while the output port of the first stage is high, the output port of the second stage is reset due to transistors 431 and 433 providing a short circuit electrical path to ground. Thus, the output port of the first stage 420 cannot be reset by a pulse going through delay 470, because the path to ground via transistor 424 is now an open circuit. The output port of the first stage then remains high and this particular embodiment of a PFD in accordance with the invention enters a full error state. This state is indicated in FIG. 6 by the flat portions of the response curve, for example. However, as the phase delay gets extremely close to 360°, because transistor 432 is stronger than the series combination of transistors 431 and 433 and the gate of transistor 431 is coupled ahead of inverter 411, this particular embodiment of a PFD in accordance with the invention will produce output signals indicating a phase delay very close to 0°, but having an opposite sign of the phase delay of the applied clock pulses, as previously explained. This is also indicated in FIG. 6. This will occur for clock pulses nearly 360° apart in phase because soon after a signal is applied to the gate at transistor 431, for example, due to the symmetry of the half-cells, half-cell 320 in this case will apply a signal to the "pulse in" port of half-cell 310 that activates transistor 432. In this embodiment, transistor 433 ensures that the same pulse that set the output port of the first stage does not also disable the resetting of the output port of the first stage, as previously explained. Therefore, for half-cell 310, for example, transistor 433 provides a short circuit to ground for the output port of the second stage after the output port of the first stage has been set and the signal produced has propagated through buffer 440 and time delay 480. Therefore, in general, time delay 480 should be large enough to ensure that the pulse produced by 410 has ended before transistor 433 is turned on.

Figure 8:
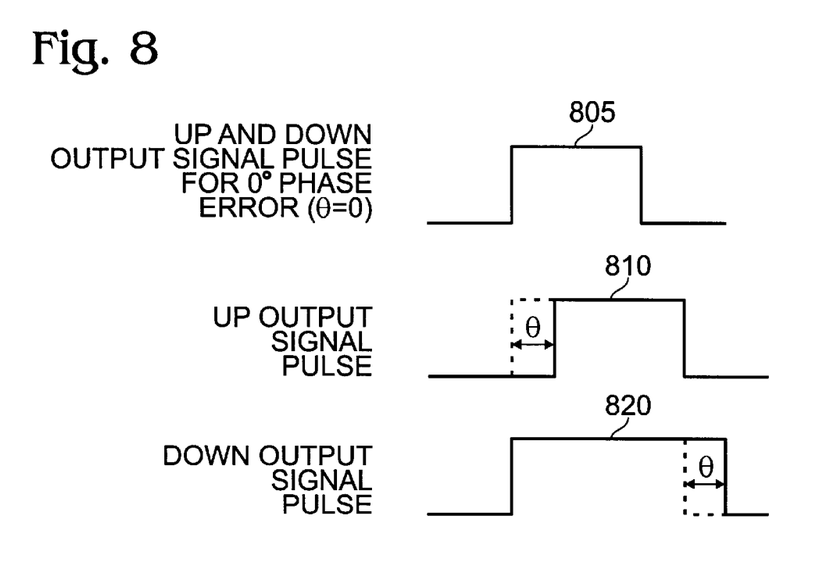
FIG. 8 is a diagram illustrating output pulses that may be produced by the embodiment illustrated in FIG. 3.

An embodiment of a PFD in accordance with the invention, such as previously described, for example, provides a variable overlap between up and down output signal pulses. At zero phase error, there is a maximum overlap with the width of the up and down output pulses being set equal by delay 470 for this particular embodiment. As illustrated in FIG. 8, as the phase error, designated theta (θ), increases, the overlap decreases to zero. The width of the pulse produced by the half-cell receiving the first clock pulse increases by the phase delay between the two applied clock pulses while the width of the pulse produced by the other half-cell, which receives the second clock pulse, decays by the phase delay between the two applied clock pulses, until the decaying pulse disappears for phase delays above a particular value.

This approach has a number of advantages. For example, an overlap is present for small phase delays between the applied clock signals, which is desirable to address the dead zone problem, previously described. However, the overlap decreases to zero as the phase delay increases, increasing the error output signal. As illustrated in FIG. 6, the response curve of this particular embodiment of a PFD in accordance with the invention also produces a higher slope near the origin due to this variable overlap. If this particular embodiment is employed in a PLL, for example, this greater scope produces more correction to the phase delay than a conventional PFD. This occurs because a larger negative feedback signal is produced for a given phase delay between the applied clock signals. In a conventional PFD, the overlap pulse, which is always produced, reduces the feedback signal for large phase errors and also large frequency errors. Likewise, in a conventional PFD, it may at times be difficult to precisely control the overlap time and reduce it to a level sufficient to address the dead zone problem, which may increase the phase error in the locked loop when the PFD is employed in a phase-locked loop, due to current source imbalance in the charge pump, for example. However, for this particular embodiment, this problem is also reduced because smaller gate delays in comparison with a conventional PFD using static gates are employed, allowing better control of the overlap time.

An embodiment of a PFD in accordance with the invention also provides the ability to disable the first stage reset, such as by the second stage in the manner previously described. By having this capability, the phase range of the PFD, which is normally limited by the reset delay in a conventional PFD, for an embodiment of a PFD in accordance with the invention, is extended to very close to plus or minus 360°, as illustrated in FIG. 6. This advantage is in addition to a greater phase range due to a smaller reset delay permitted by pulse driven dynamic CMOS logic in comparison with the reset delay of a conventional PFD employing static logic. This advantage reduces cycle slip and, hence, the lock time of a phase-locked loop including an embodiment of a PFD in accordance with the invention. Likewise, in comparison with a conventional PFD, this particular embodiment of a PFD in accordance with the invention is faster due to the pulse driven dynamic CMOS logic. Furthermore, the frequency of operation is increased because a reset path based, at least in part, on output pulses, such as for a conventional PFD, has been eliminated. Instead, reset is performed, at least in part, by applied input clock signals, as previously described. Because for a conventional PFD the availability of the reset signal depends, at least in part, on the delay through the circuitry, such an approach is slower than an approach in which the input signals are directly employed.

An embodiment of a method of producing an up signal pulse and a down signal pulse for a phase-locked loop (PLL) may be accomplished in accordance with the following steps. A reference clock signal and a PLL output clock signal, such as a feedback clock signal, may be received or applied, such as by or to input signal ports, as previously described for an embodiment of a PFD in accordance with the invention. A phase delay may separate the two applied clock signals.

An up signal pulse and a down signal pulse, such as to be applied to charge pump switches, for example, may be produced in response to the two received or applied clock signals. The up signal pulse and the down signal pulse may overlap for a period of time if the magnitude of the phase delay is less than a particular value. Otherwise, either only an up signal pulse or only a down signal pulse may be produced in response to the two received or applied clock signals. If the magnitude of the phase delay is less than a particular value, as previously described, then the period of time may be adjusted based, at least in part, upon the phase delay separating the two applied signals. Where the magnitude of the phase delay approaches a significant proportion of 360°, the feedback error signal for the PLL still remains the same sign as the phase delay separating the two applied clock signals, in contrast with prior art approaches.

While certain features of the invention have been illustrated as described herein, many modifications, changes and equivalents will now occur to those skilled in the art. It is, therefore, to be understood that the appended claims are intended to cover all such modifications and changes as fall within the true spirit of the invention.

What is claimed is:

1. An integrated circuit comprising: a phase-frequency detector (PFD) including two clock input ports, an up signal output port and a down signal output port:

said PFD comprising digital circuitry including transistors coupled in a configuration to adjust amount of overlap of an up output signal pulse and a down signal pulse based, at least in part, upon the magnitude of an amount of phase delay between two respective clock signal pulses applied to the two input ports;

wherein the pulse width of the up and down signals is variable with the amount of phase delay.

2. The integrated circuit of claim 1, wherein the magnitude of the amount of phase delay between the two clock signal pulses is more than a particular value;

said digital circuitry including transistors being in a configuration to produce either only an up output signal pulse or only a down output signal pulse when the magnitude of an amount of phase delay is more than the particular value.

3. An integrated circuit comprising: a phase-frequency detector (PFD) including two clock input ports, an up signal output port and a down signal output port:

said PFD comprising digital circuitry including transistors coupled in a configuration to produce a PFD output signal in which a sign of a phase delay indicated remains the sign of the phase delay between applied clock signal pulses even as the magnitude of the phase delay approaches a significant proportion of 360°.

4. The integrated circuit of claim 3, wherein said digital circuitry comprises digital logic circuitry including said transistors and wherein at least some of said transistors comprise CMOS transistors.

5. The integrated circuit of claim 4, wherein said digital logic circuitry comprises pulse driven dynamic CMOS circuitry that includes said CMOS transistors.

6. The integrated circuit of claim 3, wherein said PFD is coupled in a phase-locked loop (PLL) circuit.

7. The integrated circuit of claim 3, wherein said PDF has substantially no reset delay path for the PDF output signal.

8. A method of producing an up signal pulse and a down signal pulse for a phase-locked loop (PLL), said method comprising:

receiving a reference clock signal pulse and a PLL feedback clock signal pulse, a phase delay separating the clock signal pulses having a magnitude that is a significant proportion of 360°; and producing a phase error signal for said PLL in which the sign of the phase error signal produced is the sign of the phase delay.

9. The integrated circuit of claim 8, wherein said PLL has a phase-frequency detector (PFD) with substantially no reset delay path for the PFD output signal.

* * * * *